(12) United States Patent
Gelman

(10) Patent No.: US 8,686,755 B2
(45) Date of Patent: Apr. 1, 2014

(54) DOUBLE DATA RATE CLOCK GATING

(75) Inventor: Anatoly Gelman, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 100 days.

(21) Appl. No.: 13/250,042

(22) Filed: Sep. 30, 2011

(65) Prior Publication Data

US 2013/0082738 A1 Apr. 4, 2013

(51) Int. Cl.
*H03K 19/00* (2006.01)

(52) U.S. Cl.
USPC ............................................ 326/93

(58) Field of Classification Search
USPC .................................... 326/93–98
See application file for complete search history.

(56) References Cited

U.S. PATENT DOCUMENTS

| | | | | |
|---|---|---|---|---|
| 6,073,223 | A * | 6/2000 | McAllister et al. | 711/167 |
| 8,058,905 | B1 * | 11/2011 | Klein et al. | 326/93 |
| 2011/0133806 | A1 * | 6/2011 | Subramani et al. | 327/215 |

* cited by examiner

*Primary Examiner* — Thienvu Tran
(74) *Attorney, Agent, or Firm* — Sterne Kessler Goldstein & Fox PLLC

(57) ABSTRACT

Methods, systems, and computer program products are provided to implement clock gating with double data rate ("DDR") logic. In traditional single data rate ("SDR") clock gating, disabling the clock holds the clock logic level to a predefined value, potentially causing a logic transition that would be erroneously interpreted as a normal clock transition by DDR logic. Similar techniques can also be utilized to convert a SDR clock to a half-frequency DDR clock for use with DDR logic, realizing the energy efficiencies of DDR clocking.

7 Claims, 8 Drawing Sheets

DOUBLE DATA RATE CLOCK GATING

CROSS-REFERENCE TO RELATED APPLICATIONS

This application claims the benefit of U.S. Provisional Patent Application No. 61/524,538, filed Aug. 17, 2011, entitled "POWER MANAGEMENT UNIT".

BACKGROUND OF THE INVENTION

1. Field of the Invention

The present invention relates generally to power saving and, in particular, to clock gating for double data rate logic.

2. Background Art

A primary driver in the increase in computational power of modern integrated circuits is the ability to fit an increasing number of transistors in smaller and smaller areas. However, as the number of transistors increase, and therefore the number of circuits being switched, the power consumption of these circuits also increases.

One area of interest for power reduction research is the clock. In systems that have been modularly designed, clock gating can be used to stop supplying the clock to portions of the circuit that are not currently being used. For example, execution of an instruction may involve the use of one of several processing units, such as a floating point unit ("FPU") or arithmetic logic unit ("ALU").

A typical instruction may have need of only either the FPU or the ALU. If the instruction is being processed by the ALU, however, the FPU will still perform some manner of work, even though the result may not be needed. A solution is to use clock gating to disable the FPU during the relevant time interval, preventing the FPU from performing any computations and thereby wasting power.

However, existing clock gating solutions only operate on single data rate ("SDR") logic, rather than on double data rate ("DDR") logic. Accordingly, what is desired is systems and methods that provide the efficiencies of clock gating on DDR logic.

BRIEF SUMMARY OF THE INVENTION

Embodiments of the invention include a system comprising a double data rate ("DDR") clock input, a clock enable control, and a DDR clock gate configured to pass the DDR clock input to a clock output when the clock enable control is enabled, and to hold a state of the DDR clock gate when the clock enable control is disabled.

Embodiments of the invention also include a method comprising receiving a DDR clock input, receiving a clock enable control, passing the DDR clock input to a clock output when the clock enable control is enabled, and holding a state of the DDR clock gate when the clock enable control is disabled.

Embodiments of the invention additionally include a computer-readable storage device having computer program logic recorded thereon, execution of which, by a computing device, causes the computing device to perform operations comprising receiving a DDR clock input, receiving a clock enable control, passing the DDR clock input to a clock output when the clock enable control is enabled, and holding a state of the DDR clock gate when the clock enable control is disabled.

Embodiments of the invention further include a system comprising a single data rate ("SDR") clock input, a clock enable control, and a SDR clock gate configured to transition an output state of the SDR clock gate on a triggering edge of the SDR clock input when the clock enable control is enabled producing a DDR clock output half the frequency of the SDR clock input, and to hold a state of the SDR clock gate when the clock enable control is disabled.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate embodiments of the present invention and, together with the description, further serve to explain the principles of the invention and to enable a person skilled in the relevant art to make and use the invention.

Figure 1:
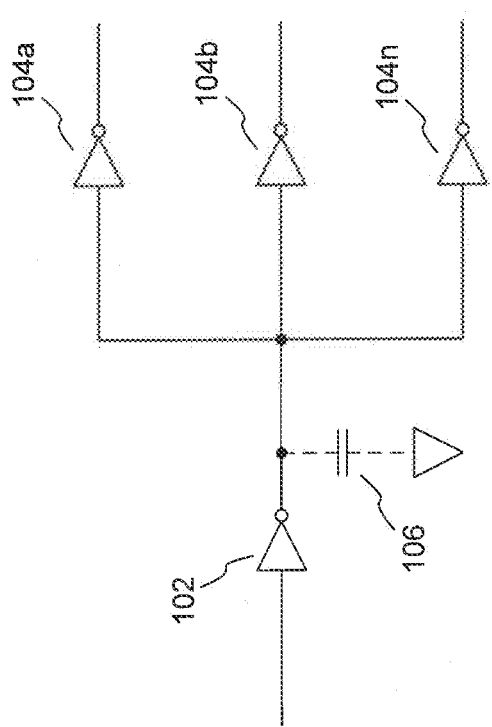
FIG. 1 illustrates an exemplary clock distribution network.

The present invention will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION OF THE INVENTION

I. Introduction

The following detailed description of the present invention refers to the accompanying drawings that illustrate exemplary embodiments consistent with this invention. Other embodiments are possible, and modifications can be made to the embodiments within the spirit and scope of the invention. Therefore, the detailed description is not meant to limit the invention. Rather, the scope of the invention is defined by the appended claims.

It would be apparent to one of skill in the art that the present invention, as described below, can be implemented in many different embodiments of software, hardware, firmware, and/or the entities illustrated in the figures. Any actual software code with the specialized control of hardware to implement the present invention is not limiting of the present invention. Thus, the operational behavior of the present invention will be described with the understanding that modifications and variations of the embodiments are possible, and within the scope and spirit of the present invention.

Reference to modules in this specification and the claims means any combination of hardware or software components for performing the indicated function. A module need not be a rigidly defined entity, such that several modules may overlap hardware and software components in functionality. For example, a software module may refer to a single line of code within a procedure, the procedure itself being a separate software module. One skilled in the relevant arts will understand that the functionality of modules may be defined in accordance with a number of stylistic or performance-optimizing techniques, for example.

FIG. 1 illustrates an exemplary clock distribution network 100. Network 100 illustrates a clock being fed through logic inverter 102, and being redistributed through logic inverters 104a-104n. One of ordinary skill in the relevant art will appreciate that other logical components (e.g., buffers) can be utilized instead of inverters. The inverters 102 and 104a-104n bring the clock to within the necessary high and low-voltage levels for the logic technology (e.g. TTL, LVTTL, PECL, CMOS, etc.) to make up for any losses caused by the distribution lines or other components.

Clock distribution network 100 also comprises capacitor 106, which is illustrative of the losses incurred whenever the logic level of the clock is switched. Capacitor 106 is not necessarily an actual capacitor, but rather representative of the capacitance of the wire between the inverters and the pin capacitance of the inverters. At a logic high (i.e., clock='1'), energy must be expended to charge the capacitor before the output lines can be driven at full voltage. At a logic low (i.e., clock='0'), the energy stored in the capacitor is drained to ground.

In order to reduce overall power consumption, it is beneficial to avoid logic switching as much as possible. This applies not only to the clock distribution network 100, but to other transistor logic in a circuit as well.

II. Power Reduction Techniques

One mechanism to reduce the number of clock transitions needed is the use of DDR clocking. In DDR clocking, devices using DDR timing will trigger on both the rising edge as well as the falling edge of a clock. In contrast, in SDR clocking, devices using SDR timing will trigger only on the rising edge of a clock (or, potentially, on the falling edge, but never on both as with DDR).

Figure 2:
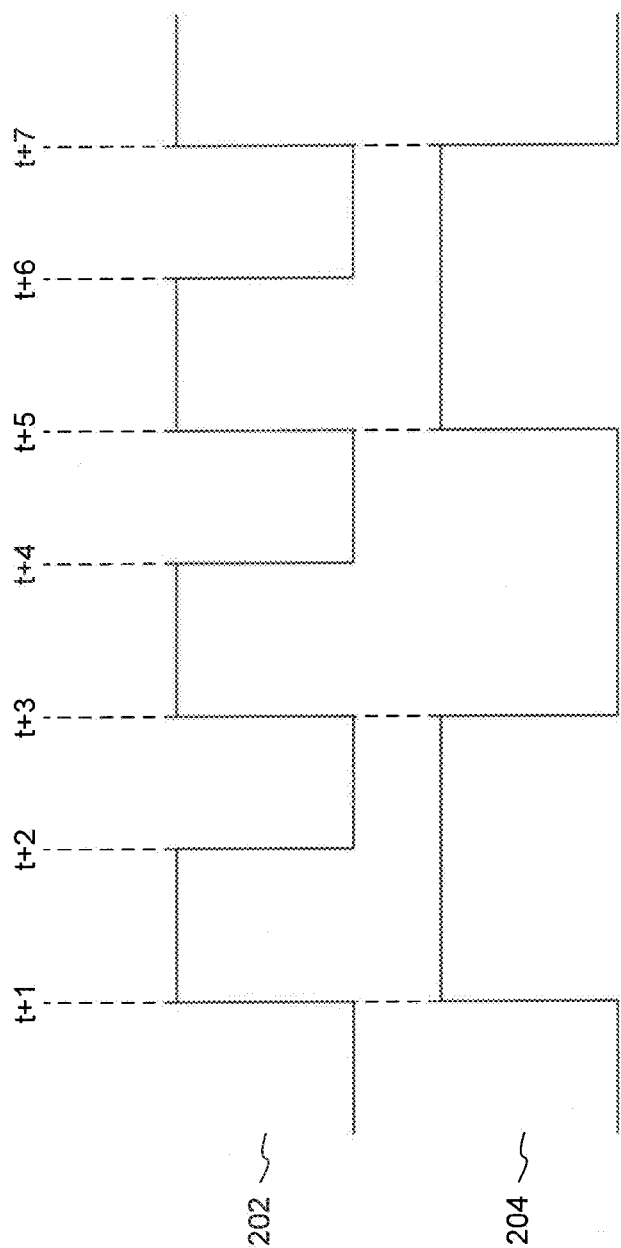
FIG. 2 is a timing diagram illustrating how an SDR clock operates at twice the frequency of a DDR clock, while clocking their respective devices at an identical rate.

Through the use of DDR clocking, the DDR clock can be operated at half the rate of an equivalent SDR clock, realizing efficiencies in power consumption due to clock switching. FIG. 2 is a timing diagram 200 illustrating how an SDR clock 202 operates at twice the frequency of a DDR clock 204, while clocking their respective devices at an identical rate.

As shown in timing diagram 200, both SDR clock 202 and DDR clock 204 have a rising edge at time [t+1]. In each case, SDR and DDR-based logic devices will be triggered by the logic 0-to-1 (low-to-high) transition. In order to prepare for delivery of the next rising edge, the SDR clock 202 has a 1-to-0 (high-to-low) transition at time [t+2], whereas the DDR clock 204 remains at a logic high. This transition, present in the SDR clock 202 but not in the DDR clock 204, unnecessarily wastes energy.

At time [t+3], both SDR and DDR-based logic devices will again be triggered by their respective clocks, demonstrating the logical equivalence between the two approaches. In the case of SDR clock 202, another rising edge occurs at time [t+3]. In the case of DDR clock 204, a falling edge occurs at time [t+3], but DDR-based logic devices trigger on both rising and falling clock edges.

Although implementation of DDR logic often comes at the cost of a few additional transistors within each logical construct, this cost pales by comparison to savings realized by reducing energy usage for the clock. A system operating at 4 GHz with a massive clock distribution network would likely attribute a significant proportion of its energy waste to clocking. The relatively few additional transistors needed to support DDR logic adds a minimal cost compared to the savings realized by reducing that same clock to a 2 GHz frequency.

Figure 3:
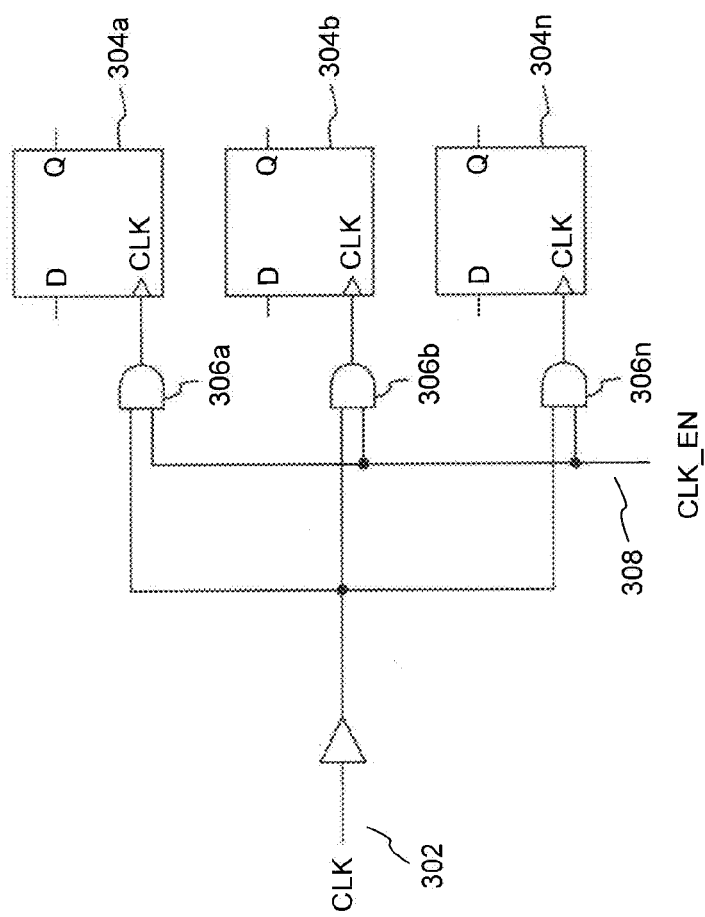
FIG. 3 is a logic diagram illustrating a clock gating technique.

As noted above, another energy saving technique is the use of clock gating. FIG. 3 is a logic diagram 300 illustrating a clock gating technique. Existing clock gating techniques, such as the one of logic diagram 300, operate on SDR clocks, and cannot be utilized with DDR clocks. In the example shown in logic diagram 300, a clock 302 is provided to SDR-based logic devices 304a-304n (shown by example as D flip-flops). To control the clock, gating logic 306a-306n (e.g., an AND gate) is introduced to allow a control line 308 (e.g., CLK_EN line) to determine whether to pass clock 302 to the logic devices 304a-304n.

Although illustrated as a single logic device apiece, each of logic devices 304a-304n may comprise an entire additional module of logic devices, potentially with additional sub-modules. Each one of these modules or sub-modules can have a gated clock, such that a control line 308 (or multiple corresponding control lines 308) can be used to disable the clock to individual modules or sub-modules.

The effect of disabling the SDR clock in this manner is to bring the clock output to a steady logic state. In the example of logic diagram 300 using AND gates, introducing a logic '0' (logic low) to the CLK_EN control line 308 forces the output of each AND gate 306a-306n to a logic '0' (logic low), regardless of the value of CLK input 302. As a result, logic devices 304a-304n (or entire modules or sub-modules represented by these devices) are stopped from farther switching, and no further propagation of clock 302 is made beyond the gating logic 306a-306n. When the CLK_EN control line 308 returns to a logic '1' (logic high), the clock 302 is passed through.

In a SDR-based logic circuit triggering on a rising edge, disabling the clock in this manner will have no adverse logical effect. If, at the time the clock is disabled, the value of the clock is a logic '0', the output of gating logic 306a-306n will continue to be a logic '0' until such time that the control line 308 is set to '1' again. If, at the time the clock is disabled, the value of the clock is a logic '1', the output of gating logic 306a-306n will transition from a logic '1' to a logic '0' and be held at logic '0' until the control line 308 is set to 1' again. However, the transition from logic 1' to logic '0' (falling edge) will not trigger any response from logic devices 304a-304n, which only operate on rising edge transitions.

One of ordinary skill in the relevant art will appreciate that, if logic devices 304a-304n are instead configured to operate only on falling edge transitions, then gating logic 306a-306n would instead be configured to transition to a logic '1' when the clock is disabled. This behavior avoids inadvertently triggering a relevant clock transition by virtue of disabling the clock.

The aforementioned SDR-based gating approach cannot be used with DDR-based logic circuits. In either case, disabling a DDR clock in this manner would potentially force a clock transition at the moment the clock was disabled, leading to logical inconsistencies. Instead, in order to disable a DDR clock correctly, it is necessary to disable the DDR clock in a manner such that its current state is preserved.

III. Double Data Rate Clock Gating

Figure 4:
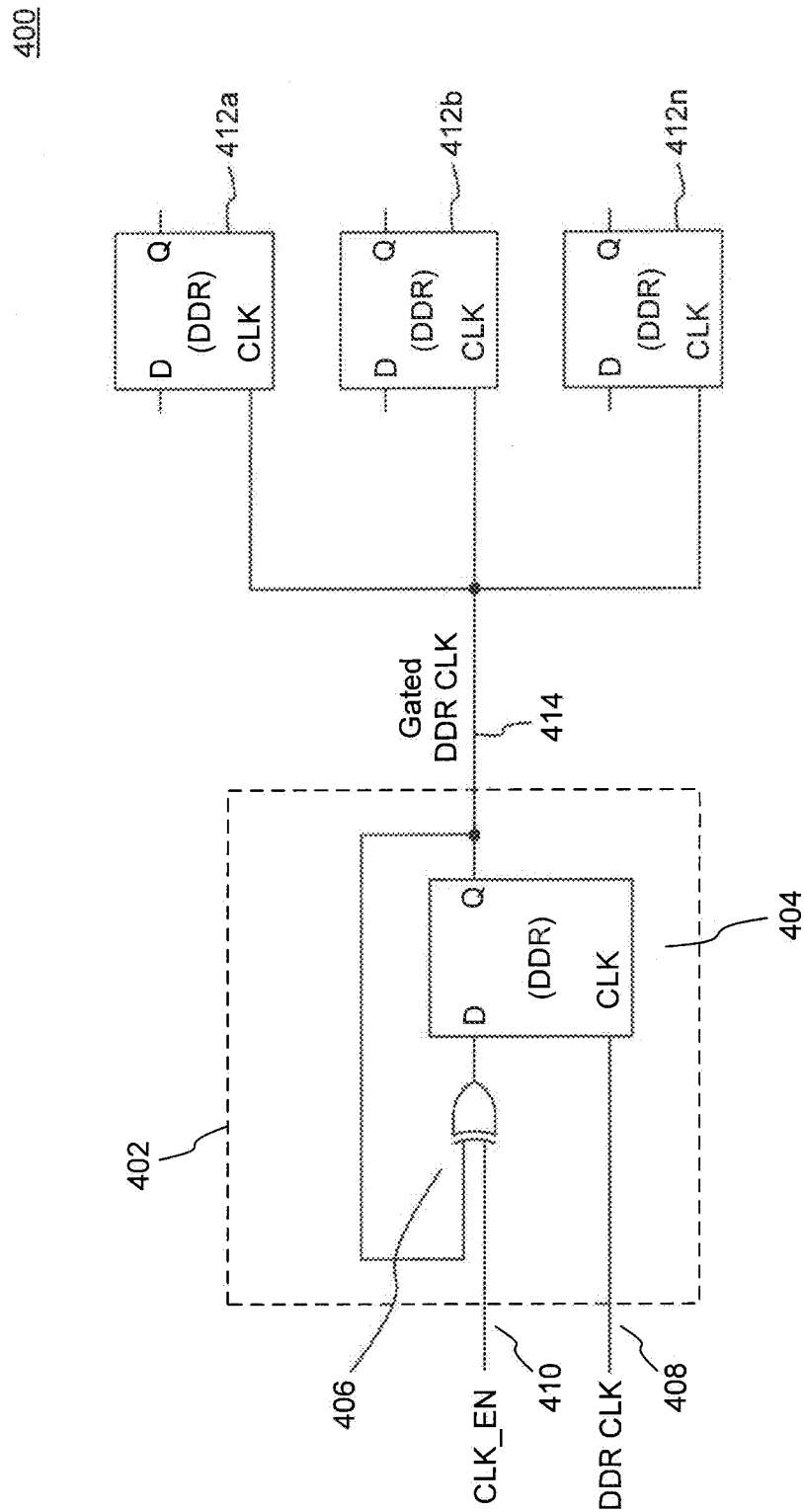
FIG. 4 is a logic diagram illustrating a DDR clock gate, in accordance with an embodiment of the present invention.

FIG. 4 is a logic diagram 400 illustrating a DDR clock gate 402, in accordance with an embodiment of the present invention. DDR clock gate 402 is illustrated through the use of exemplary individual logical components. In accordance with an embodiment of the present invention, DDR clock gate 402 is constructed using, a DDR D flip-flop ("DFF") 404 and an exclusive-or ("XOR") gate 406. One skilled in the relevant arts will appreciate that a variety of equivalent logical constructs may be utilized (e.g., variants that can be derived from a truth table), and that each of these equivalent logical constructs is contemplated within the scope of this disclosure. Additionally, variants (e.g., equivalent but inverted clock output) are also contemplated as application-specific variants within the scope of this disclosure DFF 404 is clocked by DDR clock 408, in accordance with an embodiment of the present invention. A clock enable ("CLK_EN") control signal 410 is also received by DDR clock gate 402, which determines whether to pass-through DDR clock 408 or to deactivate clocking. CLK_EN is XOR'ed with the output of DFF 404 ("DFF$_Q$") to provide the input to DFF 404.

An illustrative truth table for DDR clock gate 402 may be:

TABLE 1

DDR Clock Gate Exemplary Truth Table

| CLK_EN | DDR CLK | DFF$_Q$ Old State | DFF$_Q$ New State |
|---|---|---|---|
| 0 | don't care | 0 | 0 |
|   |   | 1 | 1 |
| 1 | 0 → 1 | 0 | 1 |
|   |   | 1 | 0 |
|   | 1 → 0 | 0 | 1 |
|   |   | 1 | 0 |

When CLK_EN 410 is '1', the result of the XOR operation has the effect of producing the opposite value to the current output from DFF 404. For example, with CLK_EN 410 set at '1', if DFF 404's output (DFF$_Q$) is '1', the output of the XOR gate 406 is '0'. If DFF 404's output (DFF$_Q$) is a '0', the output of XOR gate 406 is '1'. The output of XOR gate 406 (presented as the input of DFF 404 ("DFF$_D$")) will be latched to the output of DFF 404 (DFF$_Q$) on the next transition of DDR clock 408. As a result, with CLK_EN 410 set at '1' the output of DFF 404 (DFF$_Q$) tracks the change of state of DDR clock 408.

On the other hand, when. CLK_EN 410 is '0', the current output from DFF 404 (DFF$_Q$) is held. Notably, the output is held regardless of any transitions in DDR clock 408—the input clock will continue to transition, but will not be propagated beyond the DDR clock gate 402 while CLK_EN 410 is '0'. The output of the XOR gate 406 (presented as the input of DFF 404 (DFF$_D$)) will be equivalent to the output of DFF 404 (DFF$_Q$). The output gated DDR clock 414 (DFF$_Q$) can then be used to drive one or more DDR logic devices 412a-412n.

Aside from realizing the benefits of gating a DDR clock in a logically correct manner, gating the clock in this manner also serves the purpose of holding data. In the case of logic devices 412a-412n, the current output state of those devices can be preserved by disabling their clocks using gated DDR clock 414.

IV. Hardware Description Language Implementation

While the aforementioned benefits are commonly realized through the use of on-chip hardware implementations of DDR clock gates, one skilled in the relevant arts will appreciate that systems may also be coded in a hardware description language ("HDL") such as VHDL or Verilog HDL. These languages are used for formal description and design of digital logic circuits, and are often used for simulation of the logic circuits and for configuration of firmware in accordance with the description.

The aforementioned concepts can be applied to HDL by recognizing language constructs that can be represented through the use of a DDR clock gate 402. For example, traditional clock gating (e.g., using AND gates) could be represented in HDL by code such as:

```
@(posedge CLK)
    if (CLK_EN) Q<=D;
```

In the above example, the operation of assigning the value of input pin "D" to output pin "Q" (representing the behavior of a D flip-flop) is performed if the clock is enabled (represented by the variable "CLK_EN") at the positive (rising) edge of a clock. When an HDL interpreter identifies code following this general construct, it will simulate or design the corresponding logic circuit using AND gates or similar logic gates that will work with SDR clocked logic (i.e., only triggered on a positive edge of the clock).

Figure 5:
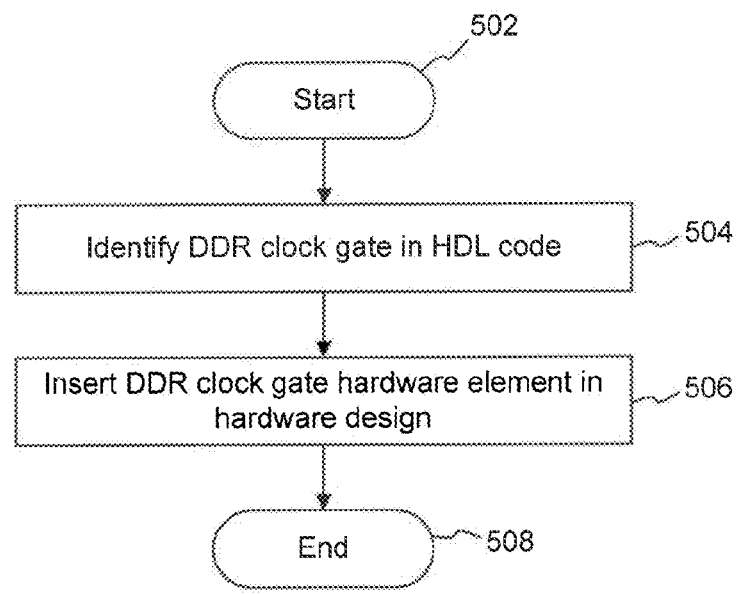
FIG. 5 is a flowchart illustrating steps by which language constructs in HDL are represented as a DDR clock gate, in accordance with an embodiment of the present invention.

FIG. 5 is a flowchart 500 illustrating steps by which language constructs in HDL are represented as a DDR clock gate, in accordance with an embodiment of the present invention. The method begins at step 502 and proceeds to step 504 where code behaving in conformance with a DDR clock gate is identified in an HDL code listing. At step 506, a DDR clock gate is inserted into the hardware design at a corresponding location, and the method ends at step 508.

In order to provide this functionality, an HDL interpreter is extended to recognize HDL code that can be represented by a DDR clock gate. Extending the above exemplary code, a DDR clock gate can be represented, in accordance with an embodiment of the present invention, by:

```
@(posedge CLK OR negedge CLK)
    if (CLK_EN) Q<=D;
```

In this example, the D flip-flop behavior is triggered on either a rising or falling edge of a clock. The HDL interpreter would recognize similar HDL code as a DDR clock gate, and would implement one accordingly in firmware or simulation. One skilled in the relevant arts will appreciate that the above exemplary HDL code can be extended to include any other logic construct discussed herein, including logical variations of the DDR clock gate and logic modules being clocked by the DDR clock gate. It is further noted that synthesis of DDR flip-flops is not handled by common HDL synthesis techniques, and the aforementioned example would extend such functionality to HDL synthesis tools.

V. Single Data Rate to Double Data Rate Clock Conversion

A further application of this gating implementation is its ability to convert a SDR clock to a DDR clock of half the frequency of the SDR clock. As previously discussed, DDR logic can produce output at the same rate as equivalent SDR logic using a DDR clock that is half the frequency of the SDR clock (see, e.g., FIG. 2). As discussed above, using the DDR clock gate, it is possible to realize the energy-saving benefits of DDR together with the additional benefits of clock gating.

However, redesigning a system to use DDR can be complicated, requiring changes to modules that, while understood by one skilled in the relevant art, can nevertheless require significant time investments. Moreover, the additional transistors needed to implement DDR versions of logic modules can require changes to layout plans.

Figure 6:
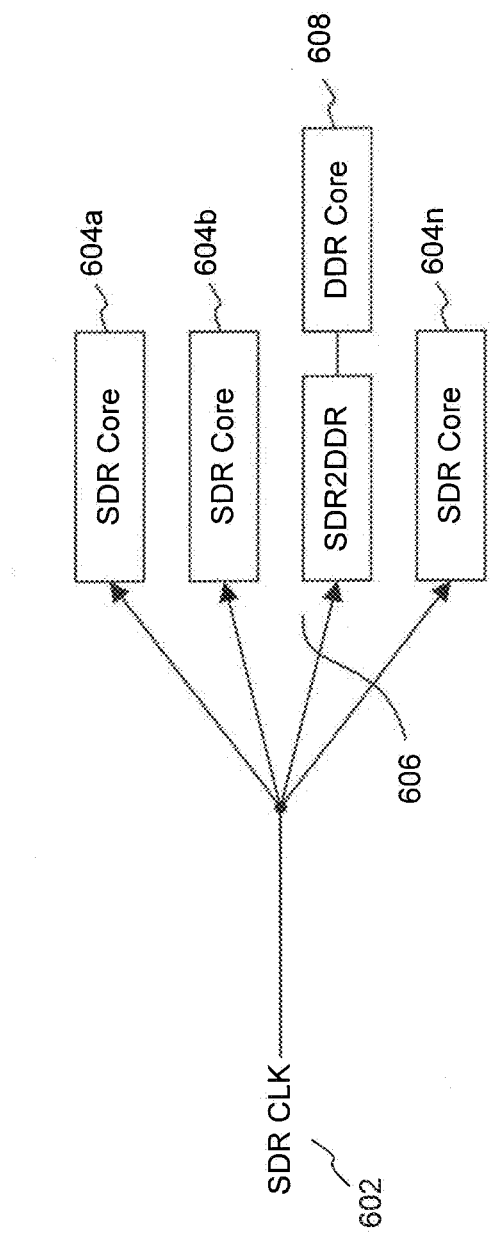
FIG. 6 is a high level system diagram, in accordance with an embodiment of the present invention.

FIG. 6 is a high level system diagram 600, in accordance with an embodiment of the present invention. In this embodiment, various SDR cores 604a-604n are clocked by an SDR clock 602. Reconfiguring the design of the system of system diagram 600 to utilize a DDR clock instead of SDR clock 602 would require a complete redesign of each of SDR cores 604a-604n. Instead, individual cores can be reconfigured as DDR cores, such as DDR core 608, by introducing a SDR-to-DDR ("SDR2DDR") converter module 606, in accordance with an embodiment of the present invention.

Figure 7:
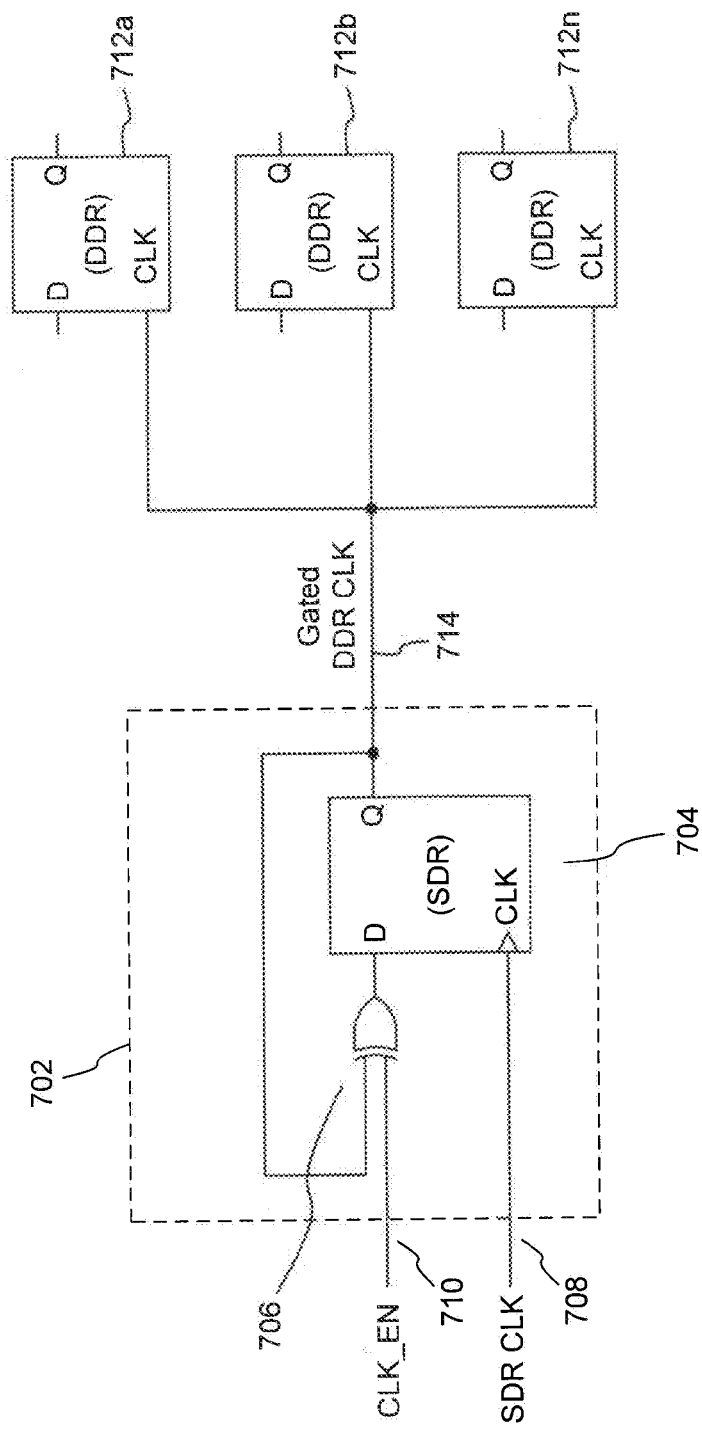
FIG. 7 is a logic diagram illustrating a SDR-to-DDR converter module, in accordance with an embodiment of the present invention.

FIG. 7 is a logic diagram 700 illustrating a SDR2DDR converter module 702, in accordance with an embodiment of the present invention. SDR2DDR converter module 702, which also performs clock gating, comprises a SDR DFF 704 and an XOR gate 706, in accordance with a further embodiment of the present invention. As before, one skilled in the relevant art will recognize that equivalent or application specific logical variations of these components can be utilized to achieve an effect that is within the scope of this disclosure, and is contemplated thereby.

DFF 704 is clocked by SDR clock 708, in accordance with an embodiment of the present invention. This means that DFF 704 will take the input ($DFF_D$) and latch it to its output ($DFF_Q$) only on a rising edge of SDR clock 708. One skilled in the relevant art will appreciate that DFF 704 can instead be configured to latch output Q on a falling edge of SDR clock 708, and the use of rising edge responsiveness is provided by way of example, and not limitation.

As before, a clock enable ("CLK_EN") control line 710 is provided to disable clock output (e.g., CLK_EN='0'), holding the state of the output of DFF 704 ($DFF_Q$). Similarly, when CLK_EN is set to enable clock output (e.g., CLK_EN='1'), the value of $DFF_D$ is toggled as the new $DFF_Q$ at every clock interval.

TABLE 2

SDR2DDR Clock Gate Exemplary Truth Table

| CLK_EN | SDR CLK | $DFF_Q$ Old State | $DFF_Q$ New State |
|---|---|---|---|
| 0 | don't care | 0 | 0 |
|   |            | 1 | 1 |
| 1 | 0 → 1 | 0 | 1 |
|   |       | 1 | 0 |
|   | Other | 0 | 0 |
|   |       | 1 | 1 |

In contrast to the DDR gated clock of FIG. 4, the clock intervals only happen at a rising clock edge of SDR clock 708. As shown in the exemplary truth table in Table 2, $DFF_Q$ is toggled only on the 0→1 transition of SDR clock 708 (rising edge of SDR clock 708).

The result of this is that gated DDR clock 714 is a DDR clock of half the frequency of SDR clock 708, in accordance with an embodiment of the present invention. Gated DDR clock 714 can then be used to drive DDR logic modules, such as DDR logic 712a-712n. Using this approach, portions of a logic circuit can be converted to use DDR logic, realizing the energy efficiencies inherent in cutting clock frequency in half (while retaining the same performance as the original SDR clock), and the further efficiencies of clock gating.

VI. Example Computer System Implementation

Figure 8:
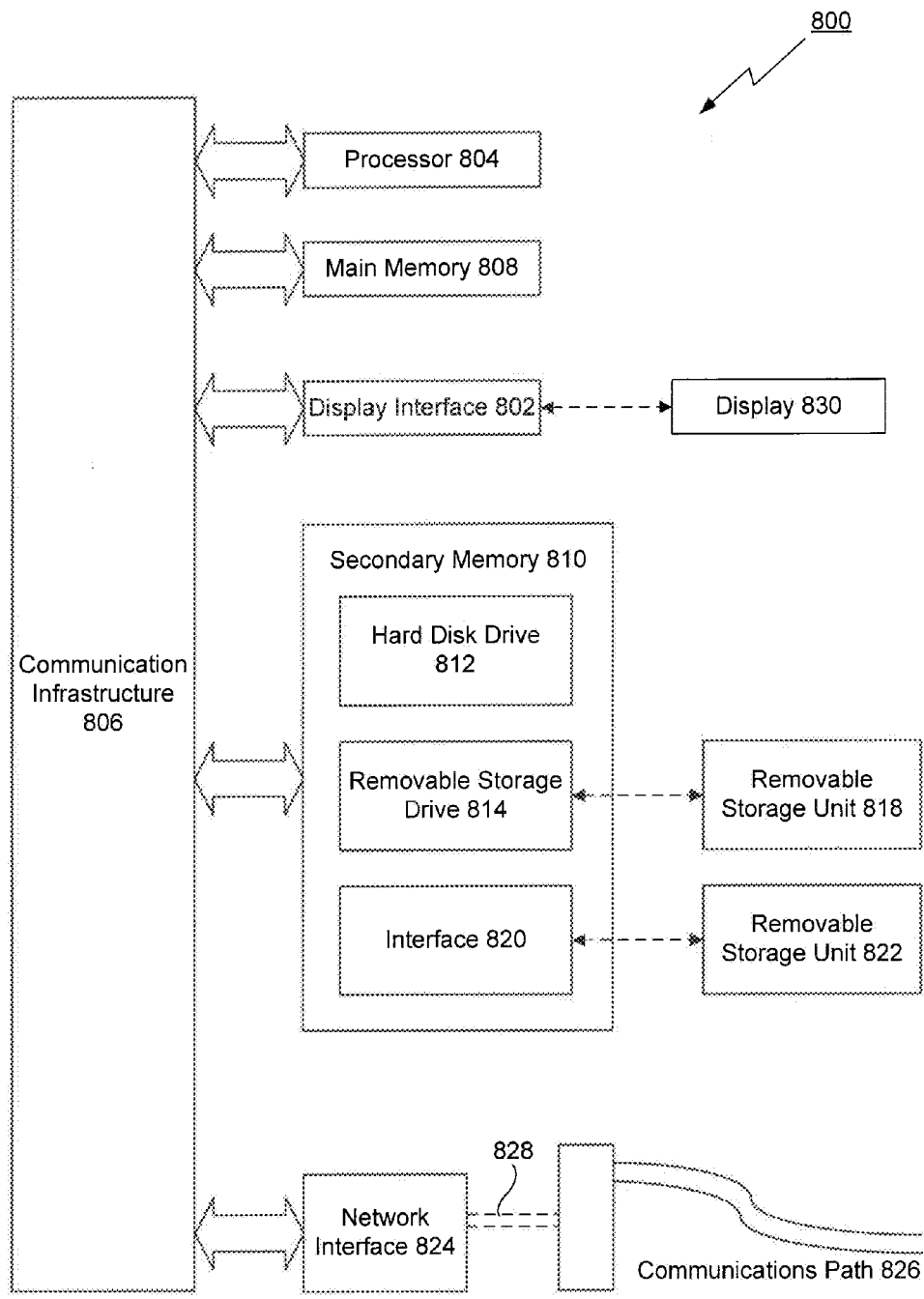
FIG. 8 depicts an example computer system in which embodiments of the present invention may be implemented.

Various aspects of the present invention can be implemented by software, firmware, hardware, or a combination thereof. FIG. 8 illustrates an example computer system 800 in which the present invention, or portions thereof, can be implemented as computer-readable code. For example, the methods illustrated by flowchart 500 of FIG. 5 can be implemented in system 800. Various embodiments of the invention are described in terms of this example computer system 800. After reading this description, it will become apparent to a person skilled in the relevant art how to implement the invention using other computer systems and/or computer architectures.

Computer system 800 includes one or more processors, such as processor 804. Processor 804 can be a special purpose or a general purpose processor. Processor 804 is connected to a communication infrastructure 806 (for example, a bus or network).

Computer system 800 also includes a main memory 808, preferably random access memory (RAM), and may also include a secondary memory 810. Secondary memory 810 may include, for example, a hard disk drive 812, a removable storage drive 814, and/or a memory stick. Removable storage drive 814 may comprise a floppy disk drive, a magnetic tape drive, an optical disk drive, a flash memory, or the like. The removable storage drive 814 reads from and/or writes to a removable storage unit 818 in a well-known manner. Removable storage unit 818 may comprise a floppy disk, magnetic tape, optical disk, etc. that is read by and written to by removable storage drive 814. As will be appreciated by persons skilled in the relevant art(s), removable storage unit 818 includes a computer usable storage medium having stored therein computer software and/or data.

In alternative implementations, secondary memory 810 may include other similar means for allowing computer programs or other instructions to be loaded into computer system 800. Such means may include, for example, a removable storage unit 822 and an interface 820. Examples of such means may include a program cartridge and cartridge interface (such as that found in video game devices), a removable memory chip (such as an EPROM, or PROM) and associated socket, and other removable storage units 822 and interfaces 820 that allow software and data to be transferred from the removable storage unit 822 to computer system 800.

Computer system 800 may also include a communications interface 824. Communications interface 824 allows software and data to be transferred between computer system 800 and external devices. Communications interface 824 may include a modem, a network interface (such as an Ethernet card), a communications port, a PCMCIA slot and card, or the like. Software and data transferred via communications interface 824 are in the form of signals that may be electronic, electromagnetic, optical, or other signals capable of being received by communications interface 824. These signals are provided to communications interface 824 via a communications path 826. Communications path 826 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 818, removable storage unit 822, and a hard disk installed in hard disk drive 812. Signals carried over communications path 826 can also embody the logic described herein. Computer program medium and computer usable medium can also refer to memories, such as main memory 808 and secondary memory 810, which can be memory semiconductors (e.g. DRAMs, etc.). These computer program products are means for providing software to computer system 800.

Computer programs (also called computer control logic) are stored in main memory 808 and/or secondary memory 810. Computer programs may also be received via communications interface 824. Such computer programs, when executed, enable computer system 800 to implement the present invention as discussed herein. In particular, the computer programs, when executed, enable processor 804 to implement the processes of the present invention, such as the steps in the methods illustrated by flowchart 500 of FIG. 5, discussed above. Accordingly, such computer programs represent controllers of the computer system 800. Where the invention is implemented using software, the software may be stored in a computer program product and loaded into computer system 800 using removable storage drive 814, interface 820, hard drive 812 or communications interface 824.

The invention is also directed to computer program products comprising software stored on any computer useable medium. Such software, when executed in one or more data processing device, causes a data processing device(s) to operate as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.).

VII. Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system, comprising:
   a single data rate ("SDR") clock coupled to an SDR logic core and clocking the SDR logic core at either one of a rising edge or a falling edge of the SDR clock;
   a clock enable control; and
   an SDR clock gate coupled to the SDR clock, and configured to transition an output state of the SDR clock gate on a triggering edge of the SDR clock when the clock enable control is enabled producing a double data rate ("DDR") clock running at half of the frequency of the SDR clock, and to hold the output state of the SDR clock gate when the clock enable control is disabled, wherein the DDR clock is coupled to a DDR logic core and clocks the DDR logic core at both a rising edge and a falling edge of the DDR clock.

2. The system of claim 1, wherein the SDR clock gate comprises:
   an XOR gate configured to operate on the clock enable control and the output state of the SDR clock gate; and
   a D flip flop, clocked by the SDR clock, and configured to receive an output from the XOR gate.

3. The system of claim 1, wherein the DDR logic core comprises:
   a DDR logic module configured to clock on the DDR clock.

4. A method, comprising:
   clocking a single data rate ("SDR") logic core at either one of a rising edge or a falling edge of an SDR clock coupled to the SDR logic core;
   transitioning, by an SDR clock gate, an output state of the SDR clock gate on a triggering edge of the SDR clock when a clock enable control is enabled, thereby producing a double data rate ("DDR") clock running at half of the frequency of the SDR clock; and
   holding, by the SDR clock gate, the output state of the SDR clock gate when the clock enable control is disabled, wherein the DDR clock is coupled to a DDR logic core and clocks the DDR logic core at both a rising edge and a falling edge of the DDR clock.

5. The method of claim 4, further comprising:
   performing an XOR operation on the clock enable control and the output state of the SDR clock gate; and
   receiving an output from the XOR gate by a D flip flop clocked by the SDR clock.

6. A computer-readable storage device having computer program logic recorded thereon, execution of which, by a computing device, causes the computing device to perform operations comprising:
   clocking a single data rate ("SDR") logic core at either one of a rising edge or a falling edge of an SDR clock coupled to the SDR logic core;
   transitioning, by an SDR clock gate, an output state of the SDR clock gate on a triggering edge of the SDR clock when a clock enable control is enabled, thereby producing a double data rate ("DDR") clock running at half of the frequency of the SDR clock; and holding, by the SDR clock gate, the output state of the SDR clock gate when the clock enable control is disabled, wherein the DDR clock is coupled to a DDR logic core and clocks the DDR logic core at both a rising edge and a falling edge of the DDR clock.

7. The computer-readable storage device of claim 6, the operations further comprising:

performing an XOR operation on the clock enable control and the output state of the SDR clock gate; and receiving an output from the XOR gate by a D flip flop clocked by the SDR clock.

* * * * *